(12) United States Patent
Janardhanan (10) Patent No.: US 9,391,653 B2
(45) Date of Patent: Jul. 12, 2016

(54) COMPUTING FILTERED SIGNAL AS MID-VALUE BETWEEN FIRST AND SECOND VARIABLES

(71) Applicant: Texas Instruments Incorporated, Dallas, TX (US)

(72) Inventor: Jayawardan Janardhanan, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 419 days.

(21) Appl. No.: 13/892,909

(22) Filed: May 13, 2013

(65) Prior Publication Data
US 2014/0335811 A1    Nov. 13, 2014

(51) Int. Cl.
*H04B 1/10* (2006.01)
*H03H 17/02* (2006.01)

(52) U.S. Cl.
CPC .............. *H04B 1/10* (2013.01); *H03H 17/0213* (2013.01); *H03H 17/0261* (2013.01)

(58) Field of Classification Search
CPC .......... H04B 1/30; H04B 1/1027; H04B 1/18; H04B 1/26; H04B 1/1638; H04B 1/10; H04B 1/7105; H03H 11/1291; H03H 7/0115; H03H 7/0161; H03H 17/00; H03H 7/0213; H03H 17/0261; H03D 11/02; H03G 3/22; H03G 5/26; B31B 7/00; B31B 2217/0076; B65B 43/22; G10L 21/0208; H04L 2025/03687; H04L 43/0858; H04L 43/0864; H04R 2460/01; H04R 25/50; H04R 25/00; H04M 1/0202
USPC ......................................... 455/254, 266, 307
See application file for complete search history.

(56) References Cited

U.S. PATENT DOCUMENTS

| | | | | |
|---|---|---|---|---|
| 3,911,776 A | * | 10/1975 | Beigel ............................. | 84/700 |
| 4,629,829 A | * | 12/1986 | Puhl et al. ..................... | 455/570 |
| 6,469,659 B1 | * | 10/2002 | Lajiness et al. ............... | 342/173 |
| 8,583,296 B2 | * | 11/2013 | Allen et al. ....................... | 701/4 |
| 2010/0183104 A1 | * | 7/2010 | Alexander et al. ............ | 375/346 |
| 2010/0296406 A1 | * | 11/2010 | Rahbar ......................... | 370/252 |

* cited by examiner

*Primary Examiner* — Lana N Le (74) *Attorney, Agent, or Firm* — Lawrence J. Bassuk; Frank D. Cimino (57) ABSTRACT

Undesired variations in a signal are removed by initializing two boundaries comprising an upper boundary and a lower boundary to track the signal level. At least one of the upper boundary and the lower boundary is adjusted encapsulate/track the received signal between the two boundaries when the signal level is outside of the two boundaries. A value computed with reference to at least one of the boundaries is provided as a filter output. As a result, the output comprises desired variations that cross the boundaries and the undesired variations that are within the boundaries are eliminated. In one embodiment, an altimeter sensor signal is filtered such that the undesired variations due to noise and instability of the altimeter are removed and the desired variations representing the change in the altitude are detected and provided without any delay to the navigation subsystem.

14 Claims, 7 Drawing Sheets

710 — INCREASE THE RANGE IF NUMBER OF TIMES THE RECEIVED SIGNAL VALUES CROSSING BOTH UPPER AND LOWER BOUNDARIES, WITHIN A TIME PERIOD, IS ABOVE THRESHOLD VALUE

720 — DECREASE THE RANGE WHEN NO RECEIVED SIGNAL VALUES WITHIN A TIME PERIOD CROSS THE UPPER AND LOWER BOUNDARY

COMPUTING FILTERED SIGNAL AS MID-VALUE BETWEEN FIRST AND SECOND VARIABLES

TECHNICAL FIELD

The present disclosure relates generally to signal processing and more specifically to a method, system and apparatus for filtering a signal with reduced delay.

RELATED ART

Filters are often employed in signal processing applications such as, but not limited to, removing unwanted components or noise present in a signal, recovering/extracting a desired signal from a composite signal, smoothing and conditioning a signal from, for example, sensors. The signal is passed through the filter to eliminate undesired components. In general, the filters are designed and implemented to operate in frequency domain and are referred to as frequency domain filters.

In frequency domain filters, the undesired components are eliminated by blocking undesired frequency components and passing the desired frequency component of the signal. Such frequency domain filters often produce phase delay or group delay as is well known in the art. Due to such phase delay/group delay, the filters may introduce a finite time delay in responding to some desired signal variations/transients.

SUMMARY

According to an aspect of the present disclosure, undesired variations in a signal are removed by initializing two variables referred to as an upper boundary and a lower boundary to track the signal. At least one of the upper boundary and the lower boundary is adjusted to track/encapsulate the received signal between the two boundaries when (if) the signal is not between the two boundaries. A value, computed with reference to the at least one of the boundaries is provided as a filter output. As a result, the output comprises desired variations that cross the boundaries. The undesired variations that are within the boundary are eliminated.

In one embodiment of the present disclosure, an altimeter sensor signal is filtered such that the undesired variations due to noise and instability of the altimeter is removed and the desired variations representing the change in the altitude are detected and provided without any delay to the navigation subsystem.

Several aspects are described below, with reference to diagrams. It should be understood that numerous specific details, relationships, and methods are set forth to provide a full understanding of the present disclosure. One skilled in the relevant art, however, will readily recognize that the present disclosure can be practiced without one or more of the specific details, or with other methods, etc. In other instances, well-known structures or operations are not shown in detail to avoid obscuring the features of the present disclosure.

DETAILED DESCRIPTION

Figure 1:
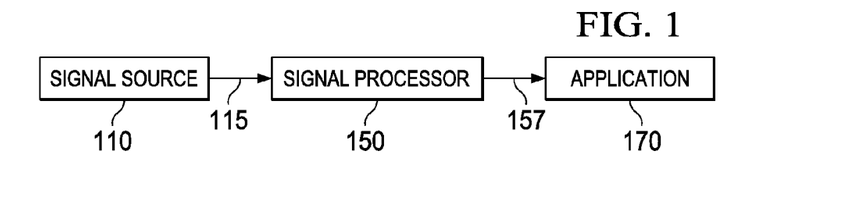
FIG. 1 is an example system in which various aspects of the present disclosure may be seen.

FIG. 1 is an example system in which various aspects of the present disclosure may be seen. As shown, the example system 100 comprises signal source 110, signal processor 150 and application 170. Each block is described in further detail below.

The signal source 110 is configured to provide an electrical signal (or signal in general) on path 115 to the signal processor 150 for further processing. In one embodiment, the signal source 110 comprises one or more sensors configured to generate an electrical signal representing one or more parameters such as, but not limited to, pressure, temperature, altitude and weight. Further, the signal source 110 may comprise electronic circuitry providing an electrical signal for transmission over a communication channel or a signal received from a communication channel. The signal source 110 may also comprise an integrated circuit providing one or more signals at its interface points or pins. The signal source may also comprise any other sources of electrical signals requiring further processing or filtering.

In one embodiment, signal source 110 is configured to provide the signal as a sequence of discrete values. Each discrete value is represented using set of digital bits. In an alternative embodiment, the signal source 110 may be configured to provide the signal in a continuous analog format, discrete analog format or other format that is compatible with the signal processor 150.

The application 170 is configured to use the processed signal on path 157 and provide one or more functionalities in the system 100. In one embodiment, application 170 is configured to provide a navigational functionality by using the processed signal on path 157. The application 170 comprises at least one of a hardware circuitry, an application specific device, and a processor executing software instruction to provide the desired functionality.

Signal processor 150 is configured to processes the signal received on the path 115 and provides the processed signal on path 157. In one embodiment, the signal processor 150 is configured to remove or filter the undesired components present in the signal on path 115. The filtered signal is provided on path 157 to the application 170. The manner in which the signal processor 150 may process the received signal is described in further detail referring to an example signal below.

Figure 2A:
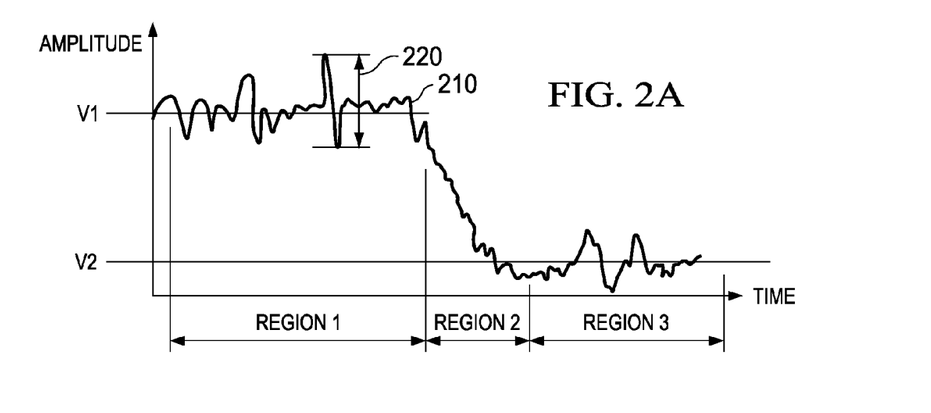
FIGS. 2A and 2B depict an example signal in time and frequency domain respectively.
Figure 2B:
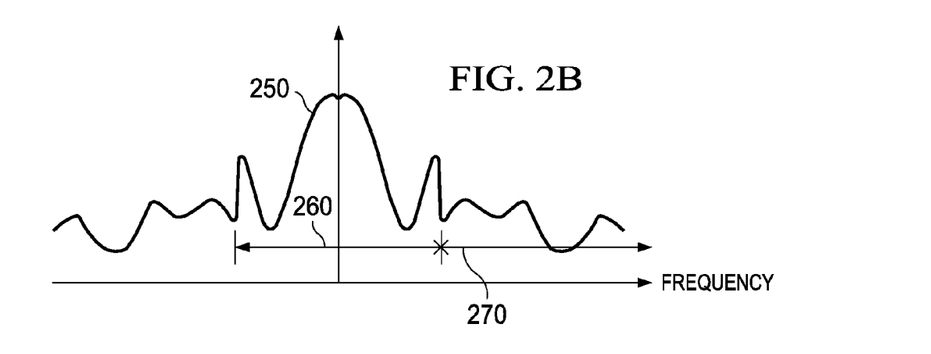

FIGS. 2A and 2B depict an example signal in time and frequency domain respectively. In FIG. 2A, the x-axis represents the time and the y-axis represents the amplitude. As shown there, in the time domain, the signal 210 is shown to vary around a value V1 in region 1 and around a value V2 in region 3. In region 2, the signal 210 is shown to transition from value V1 to V2 (region 1 to region 2). The transition in region 2 represents an example desired variation of the signal.

FIG. 2B depicts frequency spectrum of the signal 210. In FIG. 2B, the x-axis represents the frequency and the y-axis represents the amplitude or power. As shown there, the spectrum 250 of the signal 210 is shown comprising a prominent baseband frequency components 260 and subtle high frequency components 270 (together referred to as frequency spectrum of the signal 210). The high frequency components 270 may represent the instantaneous variations 220 of the signal 210 in the time domain. Some instantaneous variations 220 in the signal may be undesirable for use in some of the applications. The manner in which the instantaneous variations are removed in one prior embodiment is described below.

Figure 3A:
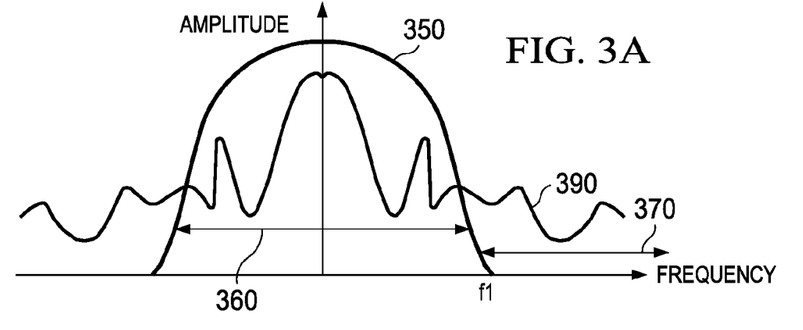
FIGS. 3A and 3B are graphs illustrating operation of a frequency domain filter employed to reduce the variations, in one prior art.
Figure 3B:
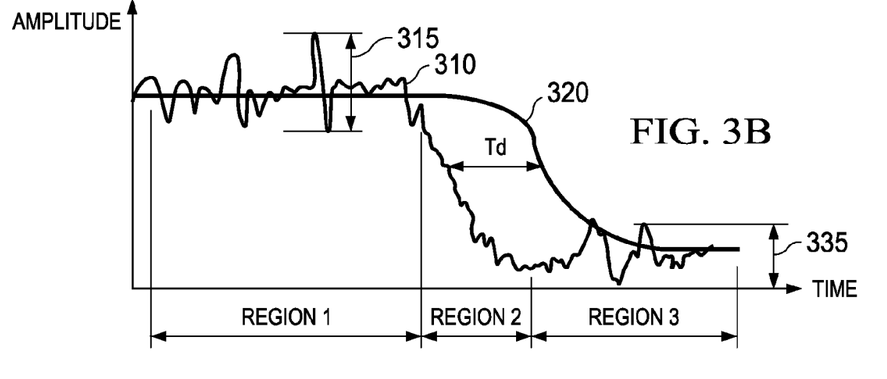

FIGS. 3A and 3B are graphs illustrating operation of a frequency domain filter employed in one prior art to reduce the undesired variations. In FIG. 3A, the curve 350 represents the frequency spectrum of the example signal. The curve 390 represents a frequency response of the prior filter. As shown there, the prior filter is implemented to pass the prominent low frequency components 360 and suppress the high frequency components 370 (above the frequency f1) to remove the undesired variations.

FIG. 3B illustrates the behaviour of the example signal in time domain due to the operation of the prior filter. In FIG. 3B, curve 310 depicts a time domain representation of the example signal and curve 320 depicts time domain representation of the filtered signal. All variations (315 & 335) in region 1 and 3 of the example signal 310 are shown removed in the filtered signal 320. However, in region 3, the filtered signal 320 is shown to transition after a particular time delay (Td) from the transition of the original example signal 310.

One reason for such time delay is the group delay of the frequency domain filter as is well known in the art. Thus, prior filters may provide a delayed response to a desired transition or may remove the desired transition in the signal. Such a delay in response to a desired transition or removal of the desired transition may be undesirable for use in some applications. The manner in which signal processor 150 may be implemented to remove undesired variation in the signal and respond to the desired transition with reduced delay according to present disclosure is described in further detail below.

Figure 4:
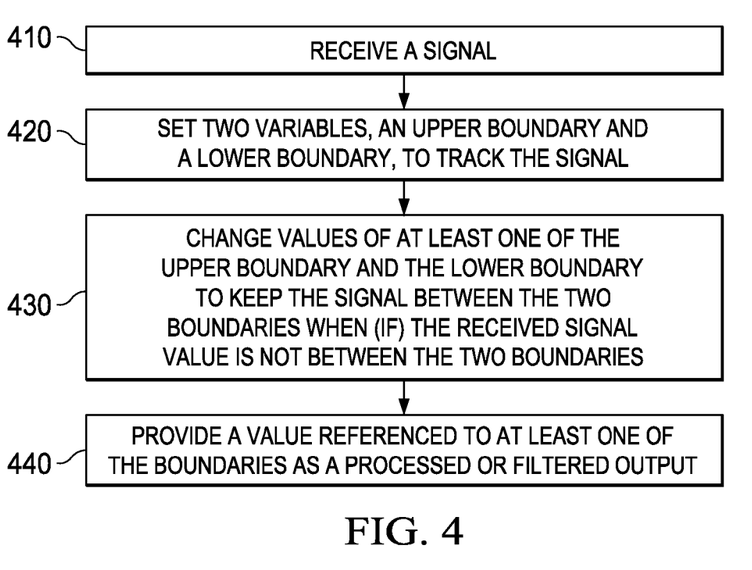
FIG. 4 is a block diagram illustrating the processing of a signal in an embodiment of the present disclosure.

FIG. 4 is a block diagram illustrating processing of a signal in one embodiment of the present disclosure. In block 410, the signal processor 150 receives a signal. The signal may be received from the signal source 110 as a sequence of signal values (levels) or a value of signal at a time instant. In one embodiment, the signal may be sampled and a sequence of samples may be fed to the signal processor 150. The signal processor may perform actions as described below for each received sample of the signal.

In block 420, the signal processor 150 sets up two variables, an upper boundary and a lower boundary, to track the signal. The upper and lower boundary, in an embodiment, are variables taking digital or analog values of the signal such as voltage, current, power or other signal measuring units. Initially, the upper boundary and lower boundary may be assigned with an initial value based on signal type. In one embodiment, the upper boundary and the lower boundary are respectively assigned a maximum and a minimum value of an N observed signal values. The N may be an integer numbers elected based on one or more parameters such as, for example, sampling rate, such that the signal is observed for at least a few cycles.

In block 430, the signal processor 150, change values of at least one of the upper boundary and the lower boundary to keep the signal between the two boundaries when (if) the received signal value is not between the two boundaries. For example, if the received signal value is outside the lower boundary (less than the lower boundary) then the lower boundary may be set equal to the value of the signal received (signal value) or may be extended (further reduced) to encapsulate the received signal value within the boundaries. Similarly, when the received signal value is greater than upper boundary, the upper boundary may be set to a value equal to the signal value or the upper boundary may be adjusted (further increased) to encapsulate the signal value. In one embodiment, the signal processor may adjust both upper and lower boundary to encapsulate the received signal value.

In block 440, signal processor 150 provides a value referenced to at least one of the boundaries as processed output. In one embodiment, mid value between the upper boundary and the lower boundary is provided as processed output or as a filtered output for corresponding received signal value. The mid value may be computed as (Upper boundary+Lower boundary)/2, i.e., the average of upper boundary (value) and lower boundary (value). Thus, any variations in the signal, that are within the boundaries, results in same mid value, thereby removing the undesired variations in the signal.

Further, when the variations in the signal causes the received signal value to fall outside of the boundary, the adjustment/shifting of at least one of the boundary causes the processed signal (filtered output) to track the new signal value/transitions with reduced delay. The difference between the upper boundary and the lower boundary is referred to as the range.

In one embodiment, the processor sets a range limit (a constant value) on the difference (upper boundary–lower boundary) to ensure that the difference does not grow unbounded. The range limit may be may be used to track the signal in addition to the upper and lower boundaries. The manner in which the upper boundary and the lower boundary may be adjusted by additionally considering the range limit is described in further detail below.

Figure 5:
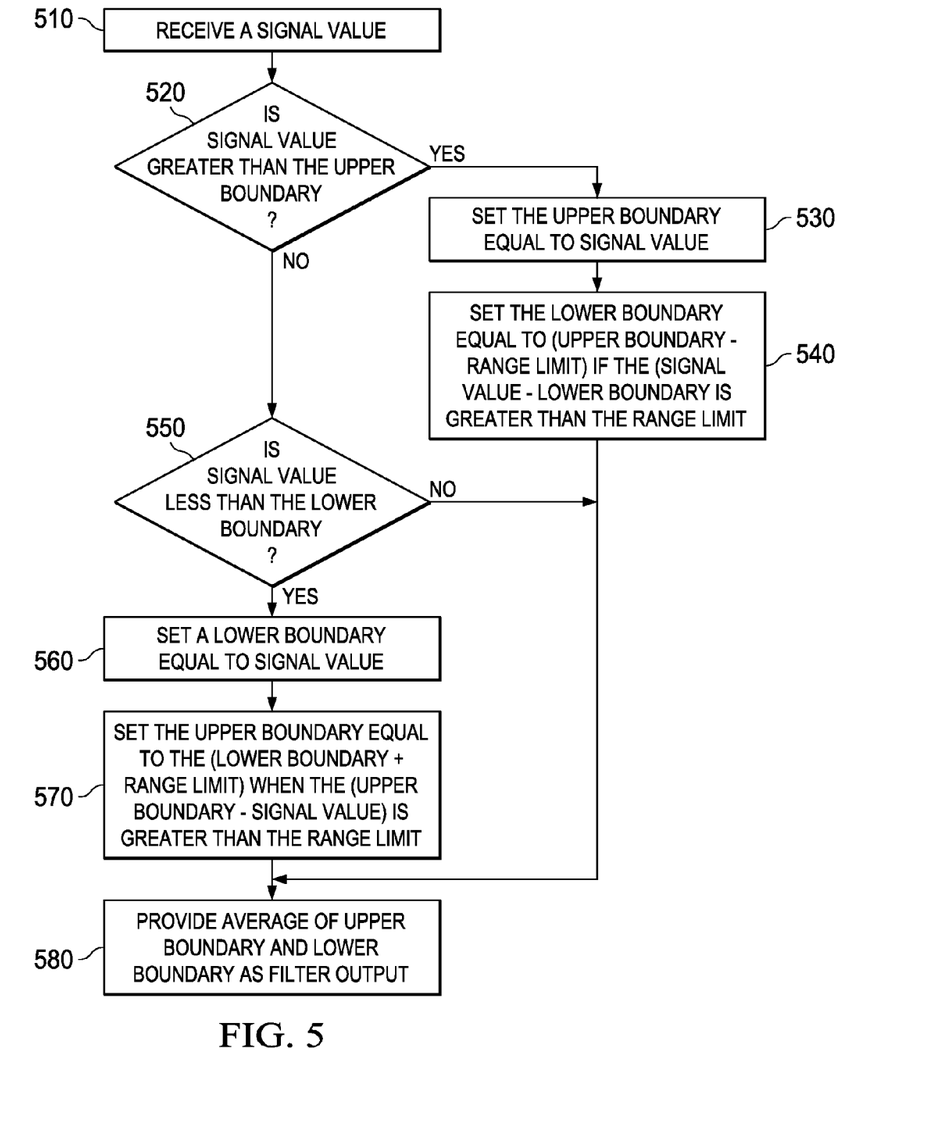
FIG. 5 is a block diagram illustrating the manner in which the boundaries may be varied for filtering a signal, in one embodiment.

FIG. 5 is a block diagram illustrating the manner in which the boundaries may be varied for processing or filtering a signal, in one embodiment. In block 510, the signal processor 150 receives a signal value. The signal value may be received in analog or digital domain. In one embodiment, the processor 150 is configured to operate in digital domain and the received analog signal may be converted to digital bits first and then provided to processor for processing.

In block 520, the signal processor 150 checks whether the received signal value is greater than an upper boundary. If the processor determines that signal value is greater than the upper boundary, the control passes to block 530. Control passes to block 550 otherwise.

In block 530, the signal processor 150 sets the upper boundary equal to received signal value. In one embodiment, the processor may set the upper boundary slightly more or less than the received signal value. For example, the upper boundary may be set to 5% more or less than the received signal value.

In block 540, the signal processor 150 sets the lower boundary equal to (upper boundary–range limit) if the (signal value–lower boundary) is greater than the range limit. The processor may verify if the range limit is exceeded when the upper boundary is set to the received signal value in block

530. If the range limit is determined to have exceeded, then the processor may pull up (increase) the lower boundary to maintain the range within (or equal to) the range limit.

In block 550, the signal processor 150 checks whether the received signal value is less than the lower boundary. If the processor determines that signal value is less than the lower boundary, the control passes to block 560. Control passes to block 580 otherwise.

In block 560, the signal processor 150 sets a lower reference equal to signal value. In one embodiment, the processor may set the lower boundary slightly more or less than the received signal value. For example, the lower boundary may be set to 5% more or less than the received signal value.

In block 570, the signal processor 150 sets the upper reference equal to (lower boundary+range limit) when (upper boundary−signal value) is greater than the range limit. The processor may verify if the range limit is exceeded when the lower boundary is set to the received input signal value in block 560. If the range limit is determined to have exceeded, then the processor may pull down (decrease) the upper boundary to maintain the range within (or equal to) the range limit.

In block 580, the signal processor 150 provides average of upper boundary and lower boundary as filtered output. The operation of the signal processor 150 is further illustrated below with an example signal.

Figure 6:
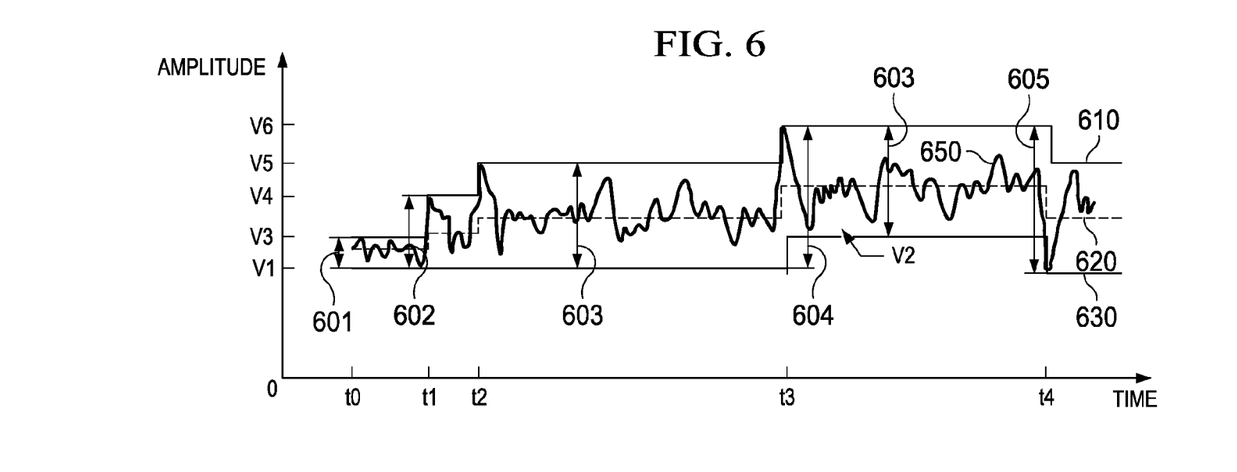
FIG. 6 is a graph illustrating the operation of the signal processor 150 in one embodiment.

FIG. 6 is a graph illustrating the operation of signal processor 150 in one embodiment. In the graph, the x-axis represents the time and the y-axis represents the amplitude. The graph is shown comprising an example signal 650, upper boundary 610, lower boundary 630, signal processor output (filtered signal) 620. The graph is further described in detail below.

The processor 150 is shown to set the initial values for upper boundary 610 at value V3 and lower boundary 630 at value V1 (at time t0). In one embodiment, the processor 150 observes the received signal till time t0 for signal maximum and minimum. The signal maximum and the minimum are respectively assigned to the upper boundary 610 and lower boundary 630 at time t0. At t0 the range 601 is equal to V3−V1.

During time period t0 through t1, the example signal is shown not crossing the boundaries (to be within the range V3−V1). Thus, the processor 150 outputs a value (V3+V1)/2 at all time instants or for all the signal values received during the time period t0 through t1 (in accordance with block 580 of FIG. 5).

At time t1, the example signal 620 is shown to assume a value V4 (received signal value) that is outside of the upper boundary V3. In accordance with the operation of block 530, the processor is shown adjusting the upper boundary 610 to the value V4 without altering the lower boundary. Thus, during time period t1 and t2, the range 602 is equal to V4−V1 and the processor outputs a value (V4+V1)/2.

At time t2, the sample signal 620 is shown to assume a value V5 that is outside of the upper boundary V4. In accordance with the operation of block 530, the processor is shown adjusting the upper boundary 610 to the value V5 without altering the lower boundary. Thus, during time period t2 and t3, the range 603 is equal to V5−V1 and the processor outputs a value (V5+V1)/2. As may be observed, the upper boundary is increased at time t1, t2 and t3 thereby the processor output 630 is also increased at the same time instances (thus tracking the variations at these time instances). Description is continued further with an example range limit equal to 603.

At time t3, the sample signal 620 is shown to assume a value V6 that is outside of the upper boundary V5. In accordance with the operation of block 530, the processor is shown adjusting the upper boundary 610 to the value V6. However, since such increase in the upper boundary causes the range 604 to exceed range limit 603, the processor is shown to pull (increase) the lower boundary 630 to a value V2 by maintaining the range same as 603 in accordance with the operation of the block 540. Thus, during time period t3 and t4, the range is equal to V6−V2 (same as V5−V1) and the processor outputs a value (V6+V2)/2.

At time t4, the sample signal 620 is shown to assume a value V1 that is outside of the lower boundary V2. In accordance with the operation of block 560, the processor is shown adjusting the lower boundary 630 to the value V1. However, since such reduction in the lower boundary causes the range 605 to exceed the range limit 603, the processor is shown to pull down (decrease) the upper boundary 610 to a value V5 in accordance with the operation of the block 570. Thus, at time t4, the range is equal to V5-V1 and the processor outputs a value (V5+V1)/2. The manner in which the range may be dynamically changed based on the signal characteristics in different example scenarios is described in further detail below.

Figure 7:
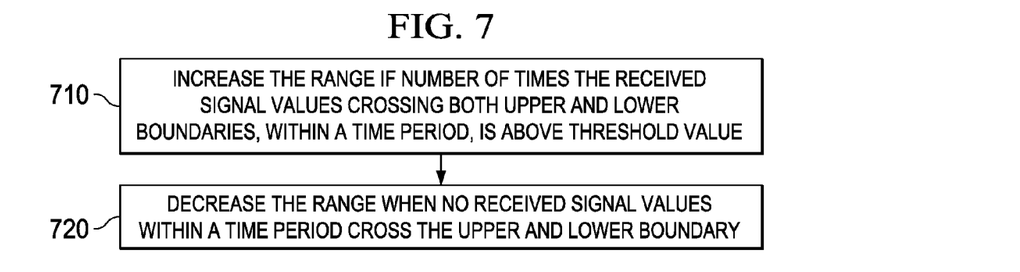
FIG. 7 is a block diagram illustrating the manner in which the filter range may be altered while processing a signal.

FIG. 7 is a block diagram illustrating the manner in which range limit may be altered while processing a signal. In block 710, the signal processor 150 increases range if the number of times the received signal values crossing both upper and lower boundaries, within a time period, is above a threshold value. The number may be counted when the signal crosses the upper and lower boundary consecutively. The scenario may represent a condition where the signal has a high amplitude noise component or high amplitude spurious noise. Due to the low range, the processor response (filtered output) may not be smooth as desired. In such situation, the processor 150 may dynamically increase the range to smooth the response. In one embodiment, the processor may increase the range limit if the range has reached the earlier range limit.

In block 720, the signal processor 150 decreases the range when none of the received signal values, within a time period, cross either upper and/or lower boundaries. The condition may represent a scenario in which the noise level in the signal is very low. Due to the high range, processor response (filtered output) may not follow some of the desired transitions. Thus, the processor may observe the signal for a pre-determined time period and may reduce the range. The reduction of range may be performed by at least reducing upper boundary, increasing lower boundary and/or changing both the boundaries.

The dynamically changing/modifying the range and/or range limit effectively filters the range. In other words, one of the effects of adaptively changing the range may be equated to adaptively changing the cut-off frequency of a frequency domain filter based on the signal characteristic. The manner in which the range is modified in one example embodiment of the present disclosure is described in further detail below.

Figure 8A:
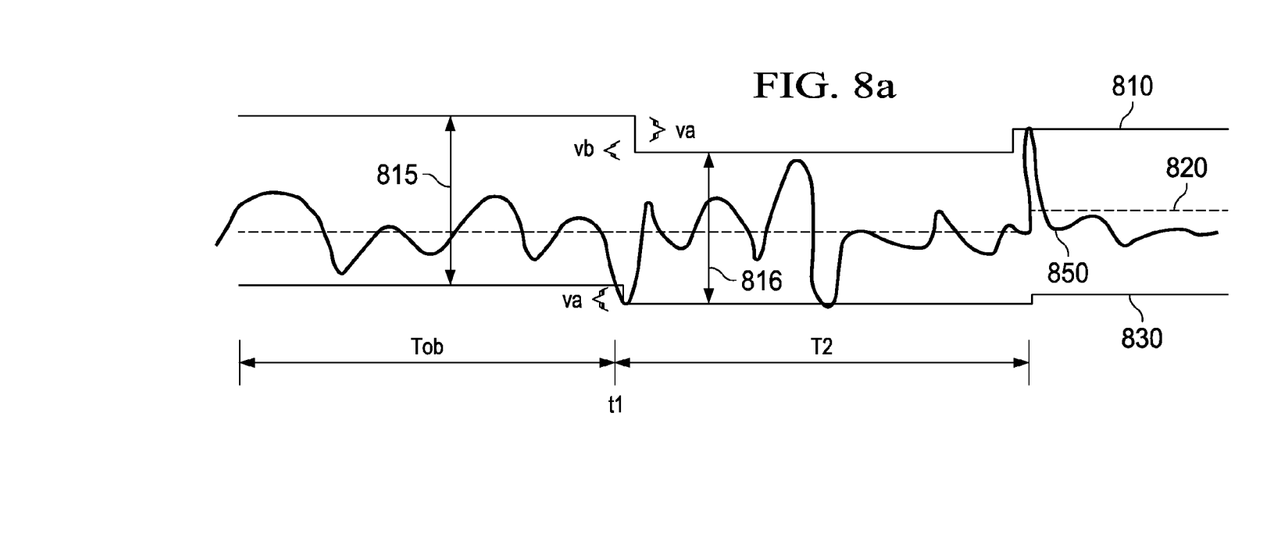
FIG. 8A is graph depicting the scenario in which the range is reduced in one embodiment.

FIG. 8A is a graph depicting the example signal variation with respect to time. The x-axis represents the time and the y-axis represents the amplitude of the sample signal. The graph is shown comprising upper boundary 810, lower boundary 830, filtered output 820, and sample signal 850. As shown there, during the observation time period time period Tob, signal value is shown to be within the two boundaries 810 and 830. Thus, the processor 150 determines to decrease the range in accordance with step 720. Accordingly at time point t1, when the signal value cross the lower boundary (signal value less than the lower boundary) the processor sets lower boundary equal to the signal value by reducing the lower boundary by a value Va. At the same time, the processor reduces the upper boundary by a value Va+Vb, thereby, reducing the range. In one embodiment, vb may be 5-10% of the range 815. In an alternative embodiment, the range may be reduced any time after the observation period by altering the upper, lower or both boundaries. The manner in which the range may be increased when the number of times the signal cross both upper and lower boundary is above a threshold, within a pre-specified time period, is further illustrated below.

Figure 8B:
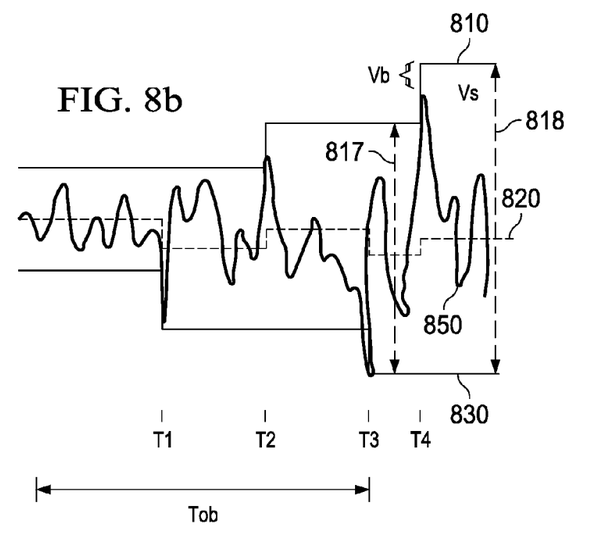
FIG. 8B is graph depicting the example scenario in which the range is increased in one embodiment.

FIG. 8B is graph depicting the example signal variation with respect to time in an alternative embodiment. The x-axis represents the time and the y-axis represents the amplitude of the sample signal. As shown, the signal crosses the lower boundary at T1 and T3, and upper boundary at T2 within an observation time period Tob. Considering that the threshold value is set to equal to three (number of times the signal crosses both the boundaries), at time T4, when the received signal value Vs is greater than the upper boundary, the processor 150 sets the upper boundary to a value Vs+Vb, thereby additionally extending or increasing the range by a value Vb. Vb may be selected to be 5-10% of the range 817. In one embodiment, if the range 817 is equal to range limit, then the range limit may correspondingly increased to accommodate the additional increase (vb) in the upper boundary 810.

Thus, due to such adjustment, the processor 150 dynamically tracks both small transition and larger transition as desired. In one alternative embodiment, the range may be increased or decreased by altering the other boundary or both the boundaries any time after the observation period.

In the above description, the signal transition is tracked using the upper boundary and the lower boundary, the signal may be tracked using one reference variable wherein the upper boundary and the lower boundary may represent a predetermined offset from the reference variable on either side. The reference variable may be adjusted or varied such that the received signal value is within the specified offsets.

The manner in which several aspects of the present disclosure may be adapted to track the altitude in one embodiment is described in further detail below.

Figure 9:
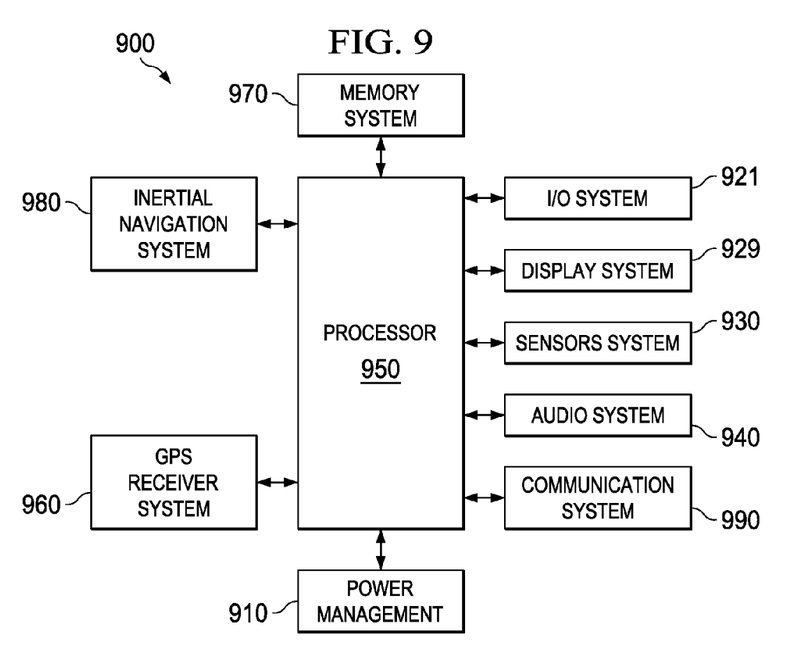
FIG. 9 is an example device in which several aspect of the present disclosure may be deployed.

FIG. 9 shows examples device in which several aspect of the present disclosure may be deployed. The example device 900 is shown comprising a power management unit 910, an input/output (I/O) system 921, a display system 929, a sensor system 930, an audio system 940, a processor 950, a GPS receiver system 960, a memory system 970, an inertial navigation system 980, and a communication system 990. Each element is described in further detail below.

The power management unit 910 provides power to the device 900 to perform desired operation. The power management unit may comprise, for example, batteries, line power or both, circuitry, integrated circuits and other functional modules to manage and distribute power to various components 910 through 990. The I/O system 921 enables an exchange of information, data or commands to and from the device 900 with external systems or a user. The I/O system 921 comprises, but is not limited to, a keyboard/pad, touch screen, USB ports, wireless ports, smart card interface, mouse and/or other control devices.

The display system 929 is configured to provide a visual output to the user of the device 900. The display system 929 comprises display devices such as, but not limited to, a display screen capable of displaying pictures, video and 3D pictures, 3D video, one or more LED status indicators, projectors, night vision lights, together with their associated drivers and ancillary components.

The sensor system 930 is configured to determine the status and conditions around the device 900. The sensor system 930 comprises multiple sensors deployed throughout the device 900 to determine the condition around the device 900 by working in conjunction with one another or independently of one another. In one embodiment, the sensor system 930 is configured to determine the context under which the device 900 is being used. The sensor system 930 includes sensors such as, but is not limited to, sensors for measuring temperature, humidity, motion, torque, magnetic orientation and/or other parameters. In one embodiment, the sensor system 930 includes a pressure sensing altimeter configured to provide altitude from the measured pressure.

The audio system 940 manages the audio interface to device 900. The audio system 940 is configured to receive an audio signal from user or from other device(s) through one or more microphones (not shown). The communication system 990 is configured to establish communication between the user device 900 and external system(s)/device(s) through one or more wireless communication channels. In one embodiment, the communication system 990 comprises functionality and components that enable the device 900 to transmit and receive data according to one or more of communication standards such as, but not limited to, GSM, CDMA, GPRS, Wi-Fi, LAN, and Bluetooth.

The inertial navigation system 980 is configured to determine the position, velocity, acceleration and/or direction of the device 900 using inertial navigation techniques. The inertial navigation system 980 is configured to determine the position of the device 900 from known (previous) positions by monitoring at least the output of the accelerometer and of the compass. The information provided by the inertial navigation system 980 is used in other systems.

The GPS receiver system 960 is configured to receive signals from multiple GNSS satellites and to perform signal processing, data processing and computations to generate an output comprising a position and velocity solution according to various aspects of present disclosure. The memory system 970 is configured to store data and instructions (e.g., one or more programs) for execution by the processor 950. The memory system 970 provides a direct interface with other system in the device 900 or through the processor 950. The memory system 970 comprises one or more of data memory and program memory. The memory system 970 includes, but is not limited to, different types of Read Only Memory (ROM), Random Access Memory (RAM), external memory disks, removable disks, flash, caches and data cards, for example.

The processor 950 is configured to execute instructions to perform various mathematical and control operations. The processor 950 comprises one or more processors or processor cores operating in conjunction to execute multiple instructions sequentially or simultaneously. The processor 950 comprises processors or cores customized to efficiently perform specific tasks, such as one or more Digital Signal Processing (DSP) cores, Math co-processors etc. In one embodiment, the processor 950 is configured to perform operations related to systems 910 through 940 and 960 through 990 by executing a respective set of instructions (programs) stored in, for example, the memory system 970. Thus, the processor 950 lends processing power to systems 910 through 940 and 960 through 990 and operates as part of the respective system. The manner in which device 900 may be configured use the altimeter signal from the sensor system 930 for navigation of the device 900 is further described below.

Figure 10:
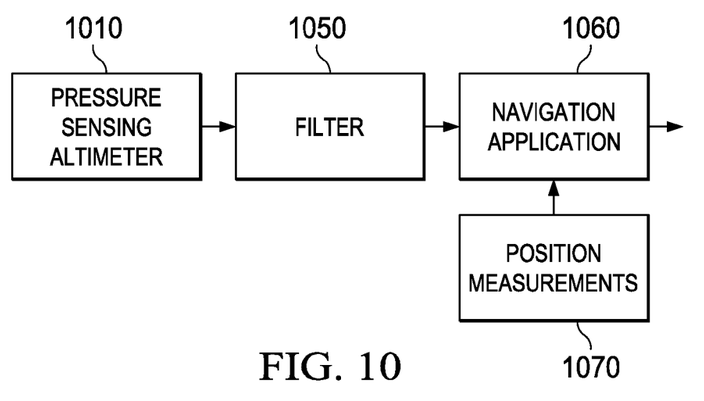
FIG. 10 is a block diagram of illustrating processing altimeter sensor signal for navigation in one embodiment.

FIG. 10 is a block diagram illustrating filtering an altimeter sensor signal for navigation application in one embodiment. The block diagram is shown comprising pressure sensing altimeter 1010, filter 1050, navigation application 1060 and position measurement unit 1070. Each block is described below in further detail.

Position measurement unit 1070 provides position information such as longitude, latitude in a suitable coordinate and format to the navigation system 1060. The Position measurement unit 1070 may comprise GPS receiver system 960, inertial navigation system 980 or any other position information resource such as cellular system. The navigation application 1060 provides navigation features in the device 900. Navigation feature may comprise, navigating the user to the desired location through predefined user interface. The navigation application is configured to provide three dimensional navigation features in the system 900. The navigation application 1060 detects altitude variation and indicates the device altitude and thereby navigates the user in three directions (altitude, latitude and longitude). For example, the device may provide user with the altitude information such location of the device with respect to as the floor of the building when user is in an elevator. In an alternative embodiment, device 900 may be configured to control a vehicle, for example to increase the acceleration when the increase in the altitude is detected.

Pressure sensing altimeter 1010 senses the pressure and provides the altitude information in the form of electrical signal. In one embodiment, the altimeter determines the altitude using known relation:

$$\text{Altitude} = 44330 * \left(1 - \left(\frac{p}{p_0}\right)^{\frac{1}{5.255}}\right) \quad (1)$$

wherein, P represents the measured pressure and $p_0$ represents the sea-level pressure (1013. 25 hP).

However, the altimeter output may have variations that are not desired for navigational purpose. The variations may be due to the noise in the altimeter or stability of the altimeter 1010. Thus the altimeter output is provided to filter 1050 for filtering undesired variations.

The filter 1050 provides the navigation unit with altitude information by eliminating the noise or undesired variations and providing the desired transitions. The filter 1050 operates according the various aspect of the present disclosure described in the sections above.

In one embodiment, the filter 1050 is implemented as part of the processor 950, in which processor 950 execute set of software instructions operative to perform the operations as described in the sections above. In an alternative embodiment, the filter 1050 may be implemented as an integrated circuit. In yet another embodiment, the filter 1050 may be implemented as a software application in the device. The software application may be loaded in to the memory 970 and the processor 950 may be configured to execute the same.

Figure 11:
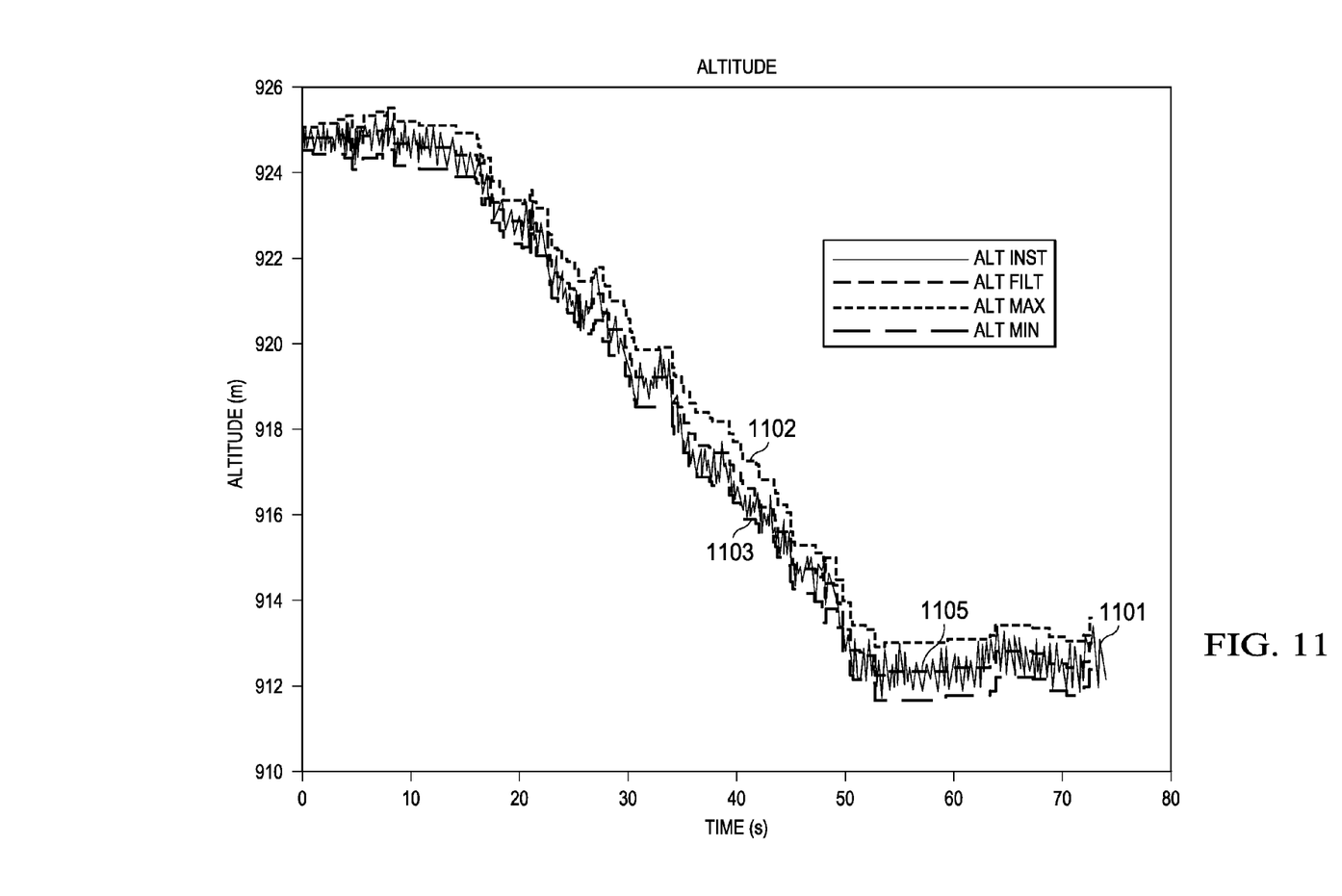
FIG. 11 is a graph depicting the example pressure sensing altimeter signal and an example filtered output.

FIG. 11 is a graph illustrating an example signal from pressure sensing altimeter 1010 and the output from the filter 1050. The curve 1101 represent an example altimeter noisy signal, curve 1102 represents the upper boundary, curve 1103 represents lower boundary and curve 1105 represents the output of the filter 1050. It may be readily observed that the undesired variations are reduced in the filtered output and the desired variations are tracked without undue delay. In one embodiment, the filter output 1105 may be further filtered using any known filtering techniques such as finite impulse response (FIR) filter (an example of frequency domain filters)

While various examples of the present disclosure have been described above, it should be understood that they have been presented by way of example, and not limitation. Thus, the breadth and scope of the present disclosure should not be limited by any of the above described examples, but should be defined in accordance with the following claims and their equivalents.

What is claimed is:

1. A method of filtering a signal comprising:
   tracking the signal using a first variable and a second variable to keep the signal between the first variable and the second variable, in which the first variable is greater than the second variable;
   changing values of at least one of the first variable and the second variable to keep the signal between the first variable and the second variable when the signal is not between the first variable and the second variable, in which the changing includes increasing the first variable to a value of the signal if the value of the signal is greater than first variable, in which the changing includes increasing the second variable to a value equal to a difference of the first variable and a range limit if a difference between the first variable and the second variable is greater than the range limit, in which the changing includes decreasing the second variable to the value of the signal if the value of the signal is less than the second variable, in which the changing includes decreasing the first variable to a value equal to a sum of the second variable and the range limit if a difference between the first variable and the second variable is greater than the range limit, and in which the changing includes increasing a range when a number of times the signal value crossing both the first variable and a second variable exceed a threshold within a observation time period, wherein the range is a difference between the first variable and the second variable; and
   providing a filtered output of the signal that is computed to be a mid-value between the first variable and the second variable.

2. The method of claim 1, in which the providing includes averaging the first variable and the second variable.

3. The method of claim 2, including receiving the signal from a pressure sensing altimeter.

4. The method of claim 3, including determining an altitude from the filtered output, in which the altitude is provided as position information.

5. The method of claim 1, in which the changing includes decreasing the range when no received signal values cross the first variable and the second variable within the observation time period.

6. An integrated circuit comprising:
   a receiving unit having an input to receive a signal level representing an altimeter sensor signal at first time instant; and
   a processor programmed to:
      track the signal using a first variable and a second variable to keep the signal between the first and second variable, in which the first variable is greater than the second variable;
      change values of at least one of the first variable and the second variable to keep the signal between the first variable and the second variable when the signal is not between the first variable and the second variable;
      increase a range when a number of times the signal level crossing both the first variable and a second variable exceed a threshold within an observation time period, in which the range is a difference between the first variable and the second variable; and provide a filtered output of the signal that is computed to be a mid-value between the first variable and the second variable.

7. The integrated circuit of claim 6, in which the filtered output is an average of the first variable and the second variable.

8. The integrated circuit claim 6, in which the processor is programmed to increase the first variable to the signal level if the signal level is greater than first variable.

9. The integrated circuit of claim 8, in which the processor is programmed to increase the second variable to a value equal to a difference of the first variable and a range limit if a difference between the first variable and the second variable is greater than the range limit.

10. The integrated circuit of claim 9, in which the processor is programmed to decrease the second variable to the signal level if the signal level is less than the second variable.

11. The integrated circuit of claim 10, in which the processor is programmed to decrease the first variable to a value equal to a sum of the second variable and the range limit if a difference between the first variable and the second variable is greater than the range limit.

12. The integrated circuit of claim 6, in which the processor is programmed to decrease the range when no received signal values cross the first variable and the second variable within the observation time period.

13. The integrated circuit of claim 6, in which the processor is programmed to provide position information comprising altitude information computed from the filter output.

14. A system comprising:

a pressure sensing altimeter configured to provide a signal level representing an altimeter sensor signal at first time instant;

a processor configured to:

track the signal using a first variable and a second variable wherein the first variable is greater than the second variable;

increase the first variable to the signal level if the signal level is greater than first variable and increase the second variable to a value equal to a difference of the first variable and a range limit if a difference between the first variable and the second variable is greater than the range limit;

decrease the second variable to the signal level if the signal level is less than the second variable and decrease the first variable to a value equal to a sum of the second variable and the range limit if a difference between the first variable and the second variable is greater than the range limit;

increase a range when a number of times the signal level crossing both the first variable and the second variable exceed a threshold within an observation time period, wherein the range is a difference between the first variable and the second variable and decrease the range when no received signal values cross the first variable and the second variable within the observation time period; and compute an altitude as average of first variable and second variable.

* * * * *